(12) United States Patent
Casey et al.

(10) Patent No.: US 9,502,895 B1
(45) Date of Patent: Nov. 22, 2016

(54) PHOTOVOLTAIC DC/DC MICRO-CONVERTER

(71) Applicant: Perfect Galaxy International Limited, North Point (HK)

(72) Inventors: Leo Francis Casey, Lexington, MA (US); Joseph T. Mossoba, Boston, MA (US)

(73) Assignee: Perfect Galaxy International Limited, North Point (HK)

( * ) Notice: Subject to any disclaimer, the term of this patent is extended or adjusted under 35 U.S.C. 154(b) by 10 days.

(21) Appl. No.: 14/716,818

(22) Filed: May 19, 2015

Related U.S. Application Data

(63) Continuation of application No. 13/361,313, filed on Jan. 30, 2012, now Pat. No. 9,048,353, which is a continuation-in-part of application No. 12/495,840, filed on Jul. 1, 2009, now Pat. No. 8,106,537.

(60) Provisional application No. 61/133,634, filed on Jul. 1, 2008.

(51) Int. Cl.
  *H02J 1/12* (2006.01)
  *H02J 7/35* (2006.01)
  *H02M 3/04* (2006.01)

(52) U.S. Cl.
  CPC .. *H02J 1/12* (2013.01); *H02J 7/35* (2013.01); *H02M 3/04* (2013.01)

(58) Field of Classification Search
  CPC ................................................ H01L 31/02021
  USPC ....................................................... 307/43, 82
  See application file for complete search history.

(56) References Cited

U.S. PATENT DOCUMENTS

| | | | |
|---|---|---|---|
| 4,404,472 | A | 9/1983 | Steigerwald |
| 4,449,057 | A | 5/1984 | Ishiwata |
| 5,327,071 | A | 7/1994 | Frederick et al. |
| 5,501,083 | A | 3/1996 | Kim |

(Continued)

FOREIGN PATENT DOCUMENTS

| | | |
|---|---|---|
| DE | 10136147 | 2/2003 |
| GB | 2425884 | 11/2006 |

(Continued)

OTHER PUBLICATIONS

PCT International Search Report and Written Opinion issued in International Application No. PCT/US2009/049350 mailed Oct. 6, 2009.

*Primary Examiner* — Robert Deberadinis
(74) *Attorney, Agent, or Firm* — Greenberg Traurig, LLP; David J. Dykeman

(57) ABSTRACT

A photo-voltaic (PV) power generating system and a control system for PV array string-level control and PV modules serially-connected into strings of PV modules. The system includes plural parallel strings of serially-connected power-generating photovoltaic modules that form a PV array, DC/DC micro-converters that are coupled to a DC voltage buss and to the output of a corresponding photovoltaic module or to the output of a string of photovoltaic modules; a gating or central inverter; and a control system. The micro-converters are structured and arranged to include at least one of: an active clamp device, a ground fault detection device, and a fractional power converter that injects power in series or in parallel with voltage or current from the power-generating portion onto the DC buss.

20 Claims, 12 Drawing Sheets

(56) References Cited

U.S. PATENT DOCUMENTS

| | | |
|---|---|---|
| 5,644,219 A | 7/1997 | Kurokawa |
| 5,669,987 A | 9/1997 | Takehara et al. |
| 5,682,305 A | 10/1997 | Kurokami et al. |
| 5,838,148 A | 11/1998 | Kurokami et al. |
| 5,892,354 A | 4/1999 | Nagao et al. |
| 6,097,109 A | 8/2000 | Fendt et al. |
| 6,127,621 A | 10/2000 | Simburger |
| 6,262,558 B1 | 7/2001 | Weinberg |
| 6,448,489 B2 | 9/2002 | Kimura et al. |
| 6,452,289 B1 | 9/2002 | Lansberry et al. |
| 6,515,215 B1 | 2/2003 | Mimura |
| 6,577,026 B1 | 6/2003 | Faller et al. |
| 6,593,521 B2 | 7/2003 | Kobayashi |
| 6,608,396 B2 | 8/2003 | Downer et al. |
| 6,628,011 B2 | 9/2003 | Droppo et al. |
| 6,657,118 B2 | 12/2003 | Toyomura et al. |
| 6,791,024 B2 | 9/2004 | Toyomura |
| 6,838,611 B2 | 1/2005 | Kondo et al. |
| 6,966,184 B2 | 11/2005 | Toyomura et al. |
| 7,091,707 B2 | 8/2006 | Cutler |
| 7,193,872 B2 | 3/2007 | Siri |
| 7,394,237 B2 | 7/2008 | Chou et al. |
| 7,479,774 B2 | 1/2009 | Wai et al. |
| 7,612,283 B2 | 11/2009 | Toyomura et al. |
| 7,719,866 B2 | 5/2010 | Boldo |
| 7,772,716 B2 | 8/2010 | Shaver et al. |
| 8,013,472 B2 | 9/2011 | Adest et al. |
| 8,106,537 B2 | 1/2012 | Casey et al. |
| 8,158,877 B2 | 4/2012 | Klein et al. |
| 8,563,845 B2 | 10/2013 | Work et al. |
| 8,751,053 B2 | 6/2014 | Hadar et al. |
| 9,048,353 B2 | 6/2015 | Casey et al. |
| 2003/0066555 A1 | 4/2003 | Hui et al. |
| 2004/0035457 A1 | 2/2004 | Kribus |
| 2005/0121067 A1 | 6/2005 | Toyomura et al. |
| 2005/0268957 A1 | 12/2005 | Enomoto et al. |
| 2006/0174939 A1 | 8/2006 | Matan |
| 2006/0185727 A1 | 8/2006 | Matan |
| 2006/0279970 A1 | 12/2006 | Kernahan |
| 2007/0000535 A1 | 1/2007 | Mesmer et al. |
| 2007/0024257 A1 | 2/2007 | Boldo |
| 2007/0137688 A1 | 6/2007 | Yoshida |
| 2007/0164612 A1 | 7/2007 | Wendt et al. |
| 2007/0235071 A1 | 10/2007 | Work et al. |
| 2007/0236187 A1 | 10/2007 | Wai et al. |
| 2008/0029153 A1 | 2/2008 | Margalit |
| 2008/0097655 A1 | 4/2008 | Hadar et al. |
| 2008/0111517 A1 | 5/2008 | Pfeifer et al. |
| 2008/0135084 A1 | 6/2008 | Scharlack |
| 2008/0142071 A1 | 6/2008 | Dorn et al. |
| 2008/0150366 A1 | 6/2008 | Adest et al. |
| 2008/0236648 A1 | 10/2008 | Klein et al. |
| 2010/0001587 A1 | 1/2010 | Casey et al. |
| 2012/0161527 A1 | 6/2012 | Casey et al. |

FOREIGN PATENT DOCUMENTS

| | | |
|---|---|---|
| JP | 2002-136112 | 5/2002 |
| JP | 2004-055603 | 2/2004 |
| JP | 2006-039634 | 2/2006 |

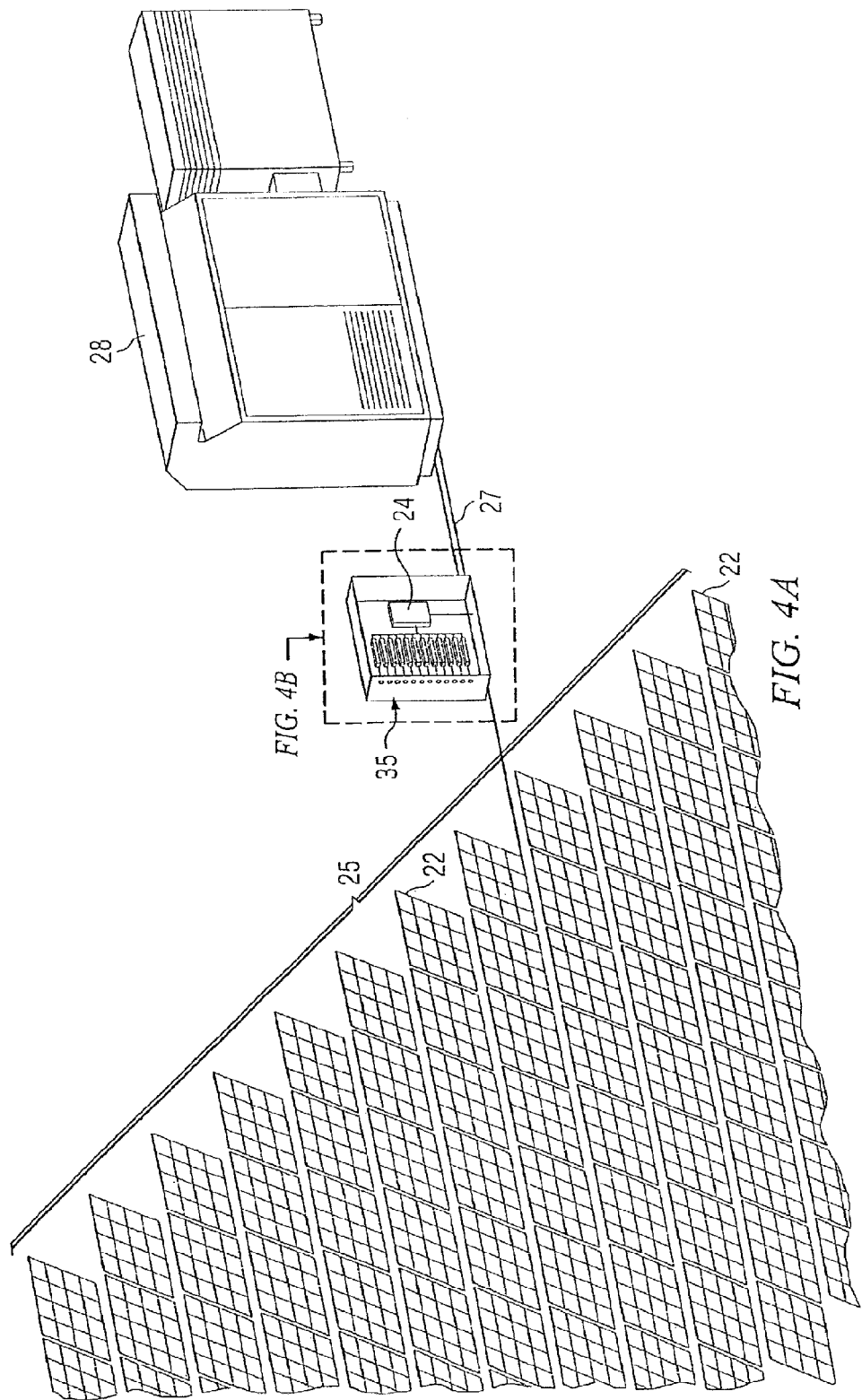

PHOTOVOLTAIC DC/DC MICRO-CONVERTER

CROSS REFERENCE TO RELATED APPLICATIONS

The present application is a continuation of U.S. patent application Ser. No. 13/361,313 which was filed on Jan. 30, 2012, which is a continuation-in-part of U.S. patent application Ser. No. 12/495,840 which was filed Jul. 1, 2009, now U.S. Pat. No. 8,106,537, and which claims the benefit under 35 U.S.C. §119(e) of U.S. Provisional Patent Application 61/133,634 filed on Jul. 1, 2008. Each of the aforementioned related patent and applications are incorporated by reference in their entireties.

STATEMENT REGARDING FEDERALLY SPONSORED RESEARCH OR DEVELOPMENT (Not applicable)

BACKGROUND OF THE INVENTION

A power converter for use with photovoltaic cells is disclosed, or, more particularly, individual DC/DC micro-converters for dedicated use with at least one photovoltaic module are disclosed.

As photovoltaic (PV) solar power installations continue to increase in number and in scale, harvesting and managing power efficiently has become more challenging. Equally as challenging is the management of PV power installations on a national level via a "smart grid". In particular, it is desirable to increase the demand for renewable energy, to supplement and/or replace energy produced via fossil fuels. Enhancing PV power use, however, requires reduction in the production cost per kilowatt hour and reduction in utility transaction costs for PV interconnections.

For the latter, traditional PV power generating and control systems use at least one of centralized inverters, bipolar centralized inverters, string inverters, and micro-inverters. Conventionally, DC/AC inverters have been used to extract maximum power from PV systems that include arrays formed by plural PV modules connected in series and parallel configurations and to convert the unregulated generated DC power to grid-voltage, synchronized AC power. The AC power generated can be transmitted and distributed either directly to AC loads or through distribution transformers. According to this traditional approach, low-voltage DC power transfer concerns and simplicity of power conversion options necessitate configuring the PV modules in serial strings and/or in parallel string arrays. However, the deleterious effects of shading, soiling, and other lighting degradation on individual PV modules and, hence, PV module characteristics matching require greater consideration.

Referring to FIG. 1, for a photovoltaic array 10 to achieve its highest energy yield and greatest efficiency, current practice includes carefully matching the electrical characteristics of each PV module 15 in each series-connected string 12 and of each parallel-connected string 14. Matching creates considerable labor and expense during manufacture at the factory. More problematically, even if PV modules 15 are ideally matched at the time of manufacture, a single PV module 15 in any string 12 can quickly degrade the performance, i.e., DC output, of the entire PV array 10. Indeed, decreasing the current or voltage output from a single PV module 15 degrades the output of the entire string 12 of series-connected PV modules 15, which has a multiplied effect on the performance of the entire PV array 10. This is especially true when direct sunlight is blocked from all or some portion of one of more of the PV modules 15.

For example, if the amount or intensity of sunlight striking a discrete PV module 15 is blocked, for example, due to shading, e.g., from clouds, vegetation, man-made structures, accumulated moisture, and the like, or due to soiling, i.e., contamination with soil or other organic or non-organic matter, then even ideally matched PV modules 15 perform poorly. Moreover, the affected PV module(s) 15 may suffer from excessive heating.

When centralized inverters 13 are used, output from plural PV modules 15 that are structured and arranged in strings 12 of parallel rows 14 of strings 12 is combined and processed. Power optimization and conditioning is, consequently, performed on the combined DC input.

Advantageously, these systems are highly evolved and reliable and, moreover, they facilitate centralized communication, control, and management through the centralized inverter 13. Disadvantageously, there is no PV string level management or control. Hence, overall array performance is still adversely affected by underperforming individual strings. Indeed, panel mismatch resulting from, inter alia, shading, soiling, and the like, reduces efficiency.

Traditionally, bypass diodes 16 and blocking diodes 18 are adapted to deal with the variability (matching) of discrete, individual PV modules 15 and with solar irradiance. More specifically, to minimize degradation of the total DC output of the array 10 that may result from mismatch or differences in the voltage or current outputs of discrete PV modules 15, bypass diodes 16 can be integrated with each PV module 15. When forward biased, the bypass diodes 16 provide an alternate current path around an underperforming PV module 15. Bypassing the underperforming PV module 15 ensures that the string's 12 voltage and current outputs are not limited by the voltage and current output of the underperforming PV module 15. Disadvantageously, bypassing the underperforming PV module 15 reduces the string's 12 voltage output by, effectively, taking the underperforming PV module 15 off-line.

Similarly, blocking diodes 18 can be integrated with strings of series-connected PV modules 12 in the PV array 10. When the total voltage output from a string of series-connected PV modules 12 exceeds a biasing voltage associated with the blocking diode 18, the DC voltage output is fed onto the DC bus for transmission to the inverter 13. However, if the total voltage output from the string of series-connected PV modules 12 is less than the biasing voltage associated with the blocking diode 18, then the blocking diode 18 is not forward biased and, hence, voltage output from the string 12 is blocked from going the DC bus.

Bi-polar centralized inverters are slightly more efficient than uni-polar centralized inverters. Advantageously, bi-polar applications tend to be cheaper, lighter in weight, and do not suffer from transformer losses, simply because they do not include a transformer. Disadvantageously, as with centralized inverters, there is no PV string level management or control, which, along with parallel processing and panel mismatch, reduces efficiency. Bias voltages may also be introduced in the array. Furthermore, although the inverters themselves do not include transformer circuitry, a transformer is still required to step up the power delivered to a commercial or utility grid.

To avoid reliance on bypass diodes 16 and blocking diodes 18, one approach has been to connect PV modules 15 to DC/AC micro-inverter(s). DC/AC micro-inverters are known to the art and embody the finest-grained configuration in which maximum possible power can be extracted from each PV module 15 regardless of mismatch, soiling, shading, and/or aging. For the purposes of this disclosure, "micro-inverters" will refer to inverters that perform a DC to AC power conversion and "micro-converters" (introduced below) will refer to converters that perform a DC to DC power conversion.

Micro-inverters are adapted to reduce mismatch and other losses by converting DC power to AC power locally, e.g., at each PV module 15 or cell and/or at every PV string 12 in the PV array 10, which facilitates string-level management. Micro-inverters have proven effective for small systems that yield higher total kilowatt hours (kWh). Disadvantageously, microinverters involve complex electronics that may require sophisticated cooling. Moreover, large-scale applications may require servicing and maintaining hundreds—if not thousands—of units, which have not yet been engineered to operate dependably for 20 years or more.

Multi-phase AC systems also need to be configured from single phase units, requiring appropriate transformer step-up to utilization and/or to distribution voltages. Moreover, although generating single phase AC power, the micro-inverter has double line frequency energy storage requirements. This generally causes either a significant ripple current through the PV module 15—which reduces yield—or requires utilization of electrolytic capacitors. Electrolytic capacitors, however, are unreliable and the acknowledged "Achilles heel" of any power conversion system that utilizes them.

Furthermore, integrating energy storage into a PV array 10 with micro-inverters is not straightforward. For example, because the DC node is internal to each of the micro-inverters, each energy storage system requires a discrete, dedicated micro-inverter. The issue of grid interaction and control can be daunting with so many devices in parallel.

Current practice needs with micro-inverters also include additional electronics, which normally are located in a hot environment, which is to say, on the reverse side (back) of the PV module 15. The ambient environment on the back of a PV module 15 is not particularly conducive to long life of the electronics, having an operating range as high as 80° C.

The challenges facing DC to DC micro-converter applications include achieving a highly reliable, lower-installed cost per Watt system that provides increased kWh yields. Such systems should provide centralized and decentralized monitoring and control features; should include electronics that can be controlled locally or remotely, to react to variable array and grid conditions; and that can be easily integrated with a commercial or utility grid.

U.S. Pat. No. 6,127,621 to Simburger discloses a power sphere for a spinning satellite that purportedly minimizes mismatch losses on the solar cells by providing individual DC/DC "regulators" for each individual solar cell, to regulate the power delivered to a load. U.S. Pat. No. 6,966,184 to Toyomura, et al. discloses a PV power-generating apparatus having power conversion devices individually connected to solar cell elements to convert the output of the elements. The plural DC/DC converters are connected in parallel and are operated so that changes in the input voltage to a DC/AC inverter move the operating point of the solar cell element, which changes the input voltage to the DC/DC converters. In this manner, input voltage to the DC/AC inverter from each converter is controlled to be the same.

U.S. Pat. No. 7,193,872 to Siri discloses a power supply having an inverter for connecting plural DC power sources to a utility grid using a single DC/DC conversion stage. The Siri system purports to control current based on feed-forward compensation as some function of an input power commanding voltage ($V_{ERR}$). More specifically, the current and voltage from a solar array are sampled from which the input power commanding voltage is output. A current reference generator generates a reference current ($I_{REF}$) which is the product of the input power commanding voltage, an instantaneous utility line voltage, and the inverted square of the $V_{RMS}$ signal.

A photovoltaic power system that includes plural photovoltaic strings or an array of power-generating photovoltaic modules and a controller therefor that provide PV string level control, to regulate and stabilize output voltage of each PV string individually, to harvest greater energy and increase kWh produced is desirable.

Means for integrating replacement modules into a PV array without having to match the electrical properties of the replacement module to those of the modules already in the array is also very desirable.

SUMMARY OF THE INVENTION

A photovoltaic power generating system is disclosed. The system comprises a string or array of power-generating photovoltaic modules; a plurality of micro-converters, each of which is coupled to a DC voltage buss and to the output of a discrete photovoltaic module of the string or array of power-generating photovoltaic modules; and a gating inverter that is structured and arranged to provide AC power to a grid; or equivalently a gating DC/DC converter that is coupled to a high voltage DC buss for industrial DC power supply applications, e.g., DC power supplies for chlor-alkali or copper-winding electrochemical processes.

The photovoltaic power system is structured and arranged to maximize design flexibility, which leads to enhanced longevity. For example, different panel technologies, vintages, sizes, mounts, and manufacturing brands can be incorporated into the same array, which can be efficiently controlled by the disclosed invention. The range of power ratings for the disclosed system is between 30 kW and 1 MW.

Managerial benefits include increased visibility which includes in-depth diagnostic and performance information, enabling the conditions of PV strings and/or corresponding DC/DC converters to be monitored remotely. As a consequence, poorly performing or malfunctioning PV strings or PV strings having ground faults can be systematically isolated without interrupting throughput from the remaining PV strings.

From a performance standpoint, both energy throughput and return on investment (ROI) can be increased significantly. Indeed, eliminating losses that otherwise would occur when outputs from PV string in parallel are combined and processed reduces the cost per kWh through the lifespan of the PV array. An increase in output of between 5 and 20 percent is predicted.

BRIEF DESCRIPTION OF THE SEVERAL VIEWS OF THE DRAWINGS

The invention will be more fully understood by referring to the Detailed Description of the Invention in conjunction with the Drawings, of which:

FIGS. 4A-4C show an isometric view of DC/DC photovoltaic system (4A) and insets showing coupling of plural PV strings to the micro-converter (4B) and coupling of plural micro-converters to a local controller (4C) within a string combiner according to the present invention;

DETAILED DESCRIPTION OF THE INVENTION

Referring to FIGS. 2-5 a photovoltaic (PV) system controlled at the string-level by plural DC/DC micro-converters will now be described. The PV system 29 and, more specifically, the control system 21 for the PV system 29 is structured and arranged to extract maximum individual string power (hereinafter, the "Maximum Power Point" or "MPP") from each of the PV modules 22 in each string 25 of serial-connected PV modules that make up the power-generating portion of the PV system 29.

Figure 5:
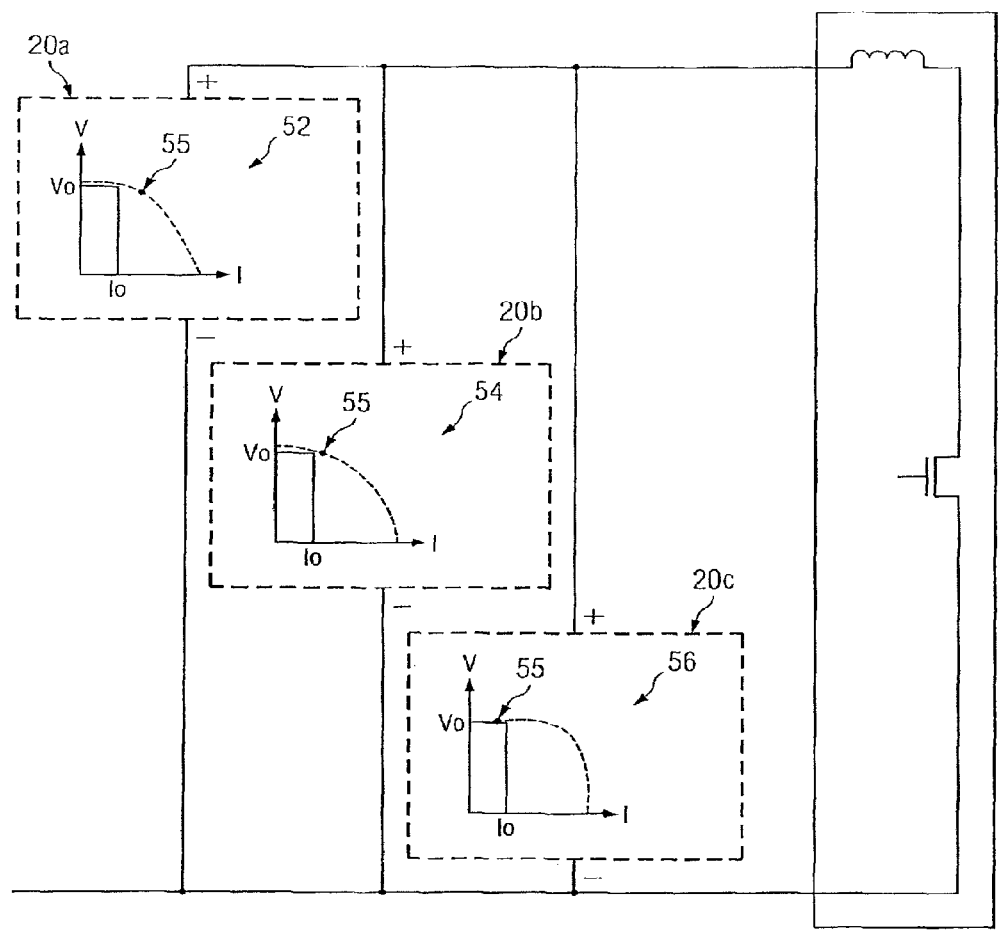
FIG. 5 shows representative current-voltage curves for three PV strings of PV modules.

The desirability of string-level control is shown illustratively in FIG. 5, which shows current-voltage curves 52, 54, and 56 for three discrete strings of PV modules. Each of the curves 52, 54, and 56 includes an MPP 55 at some location on the curves. The MPP 55 refers to the point of maximum power for an entire string 25 of PV modules 22.

Because of expected mismatch between PV strings 25, the corresponding MPPs 55 for each string 25 occur or may occur at different currents and/or at different voltages for each PV string 25. As a result, the controller 21 is adapted to regulate and to stabilize output voltage from each PV string 25 at each MPP 55, to harvest greater energy and increase kWh produced.

Were the controller 21, instead, adapted to regulate output current or output voltage using a fixed, predetermined voltage or a fixed, predetermined current, which is shown illustratively in FIG. 5 at current $I_o$ and voltage $V_o$, the MPP 55 for each PV string 25 may be missed, which means less energy and fewer kWh produced.

The PV System

The PV system 29 includes a power-generating portion, a power control and distribution portion, and the aforementioned control system. In the discussion below, those of ordinary skill in the art can appreciate that elements described as structure for the power-generating portion could, instead, be included as elements for the power control and distribution portion or the control system, and vice versa. For example, the MPP controller 21, the control unit 24 for the gating inverter 28, and the central or micro-grid controller 34, which are described below as separate and distinct elements of the power-generating portion, the power control and distribution portion, and the control system, respectively, could, instead, be included as elements in a single control structure for exercising control over all aspects and operation of the PV system 29.

Figure 1:
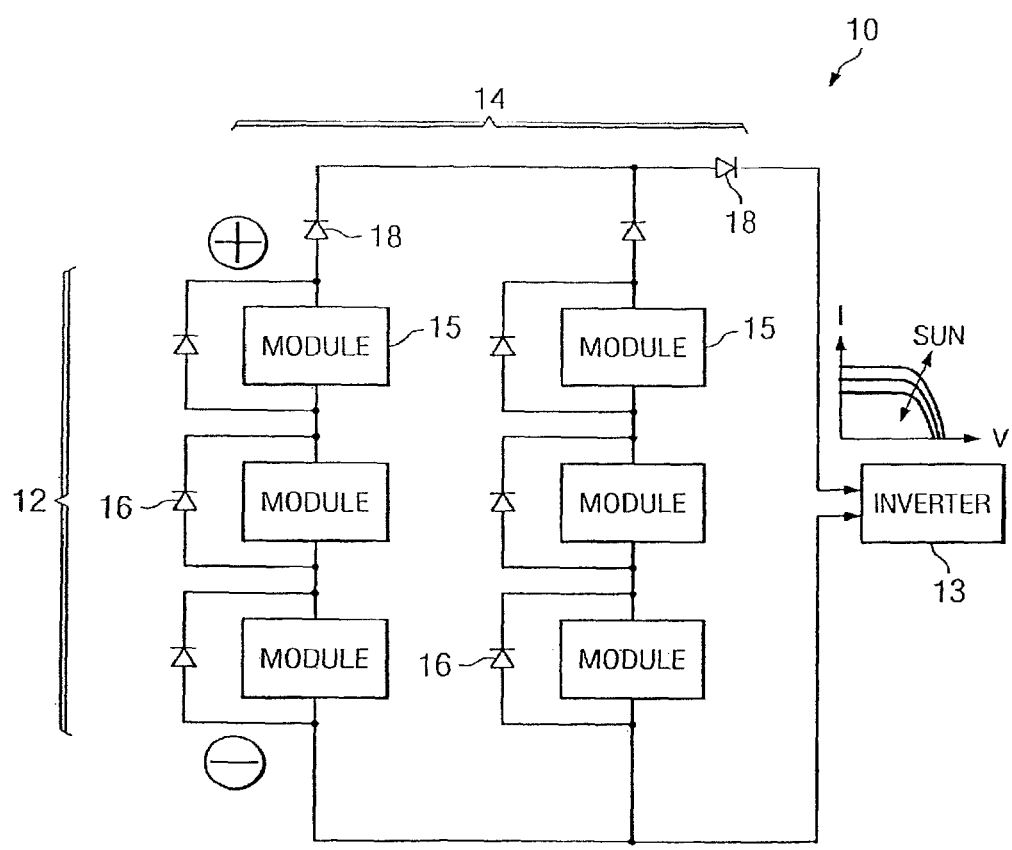
FIG. 1 shows an array of series- and parallel-connected photovoltaic power modules according to the prior art.
Figure 2:
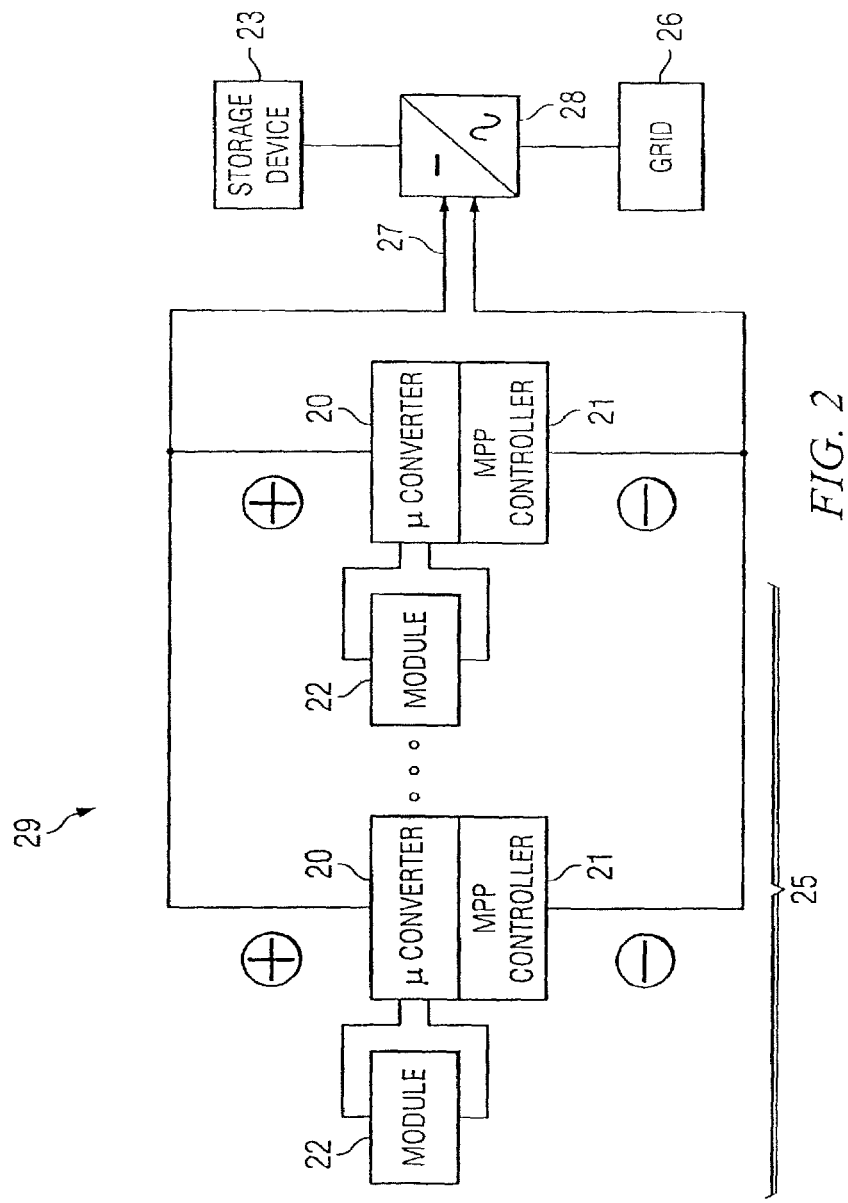
FIG. 2 shows an array of series- and parallel-connected strings of photovoltaic power modules with micro-converters according to the present invention.

In general terms, referring to FIG. 2, the power-generating portion of the PV system 29 includes plural parallel-connected PV strings 25 of PV modules 22 that collectively form a PV array. PV modules 22 are well known to the art and will not be described in detail. The PV array corresponds to multiple PV strings 25 that are electrically disposed in parallel so that the output of each PV module 22 and each PV string 25 is delivered to a common buss. The power control and distribution portion includes plural DC/DC power converters 20 each having a local MPP controller 21, and a large, distribution substation-class, grid-connected (gating) inverter 28 having a control unit 24.

The PV system 29, and, more particularly, the control system is structured and arranged to ensure that any PV module(s) 22 that become(s) shaded from direct sunlight, that become(s) contaminated with dirt or grime, and/or that are otherwise covered with or by some foreign matter on all or on any portion of the PV module(s) 22 does not cause an entire PV string 25 of the PV array or multiple strings 25 in the array, to operate at less than maximum power transfer efficiency, i.e., outside of MPP. In short, rather than allowing a single PV module 22 or a few affected PV modules 22 to diminish power generation of the entire PV array, the control system is structured and arranged to temporarily prevent the affected PV module(s) 22 from delivering power to the voltage buss 27 until such time as the cause of the affectation has been corrected.

Figure 4B:
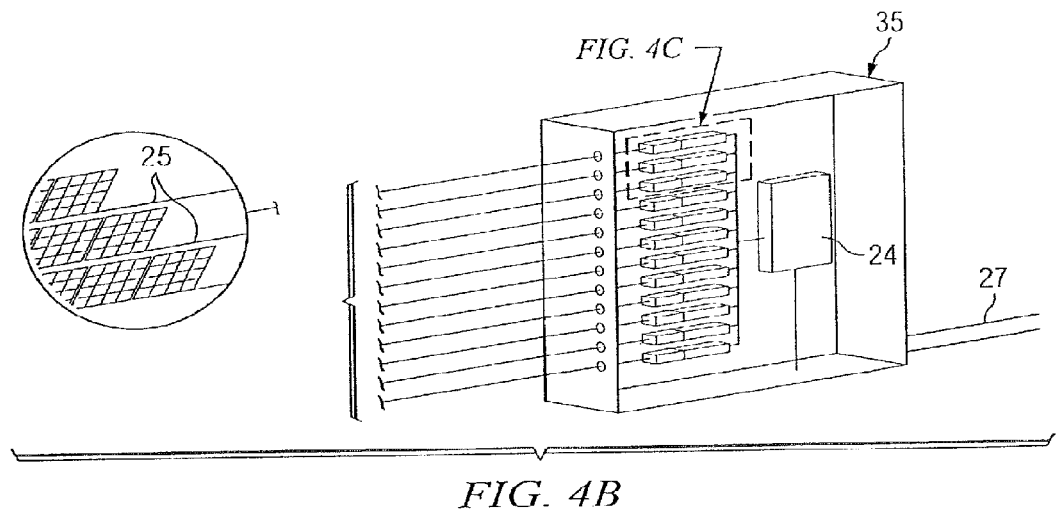
Figure 4C:
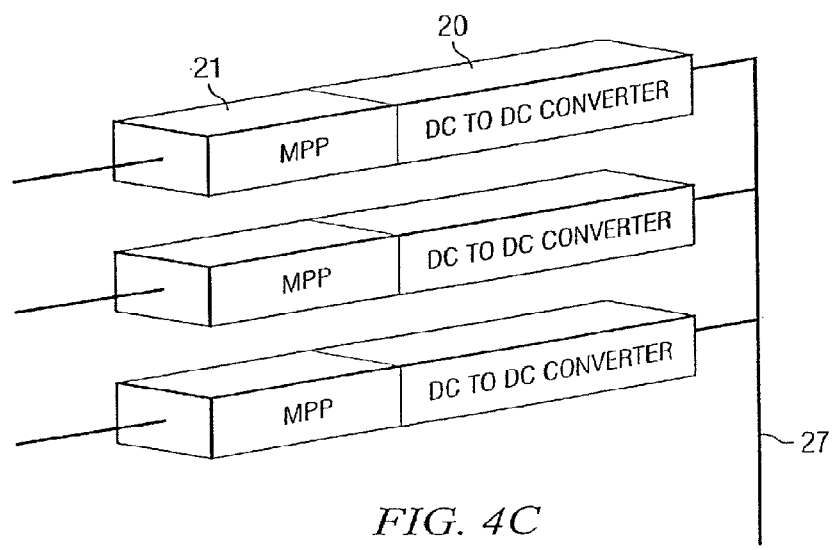

Referring to FIG. 2, a serial PV string 25 having plural PV modules 22 that are electrically disposed in parallel is shown. Advantageously, a dedicated power converter 20 (hereinafter "micro-converter") is coupled to the output of each PV module 22 and/or to each PV string 25 of PV modules 22. The micro-converter 20 can be physically mounted on the reverse side (back) of the discrete PV module 22 that it controls. Alternatively, as shown in FIG. 4A-4C, discrete micro-converters 20 that are electrically coupled to corresponding PV modules 22 or PV strings 25 of PV modules 22 can be centralized in a control box 35, such as the Solstice™ system manufactured by Satcon Technology Corporation of Boston, Mass. The Satcon control box 35 is a natural replacement for combiner boxes or "smart" combiner boxes, which are in common use in popular PV systems today.

The micro-converters 20 are adapted to receive the input from that PV module 22 and/or from an entire string 25 of PV modules 22. More specifically, each micro-converter 20 is adapted to receive electrical operating parameters, e.g., terminal current, terminal voltage, power, and the like, from a corresponding PV module 22 and/or from an entire string 25 of PV modules 22. Optionally or alternatively, the micro-converter 20 can also be adapted to receive thermal operating parameters from the associated PV module 22. Each micro-converter 20 is adapted to communicate these operating parameters to the control unit 24 of the gating inverter 28 (or converter) and/or to a remote, central controller 34. The means of communicating such data can include using powerline carrier communication, a wireless connection, and so forth.

This communications capability allows each micro-converter 20 to sense a current level and/or voltage level generated by each PV module 22 and/or string 25 of PV modules 22 and to communicate with the control unit 24 of the gating inverter 28 and/or to communicate remotely with the central controller 34, to provide PV module 22 status signals. As a result, the control unit 24 of the gating inverter 28 and/or the remote central controller 34 can communicate with an associated Energy Management System or utility or microgrid system controller, to provide fine-grained information on the performance of the PV modules 22, the PV strings 25, and the entire PV array.

The topology of the micro-converter 20 can include (for example and not for the purposes of limitation): an interleaved boost converter, an interleaved flyback converter, an interleaved forward converter, an H-bridge converter, a multistage converter, isolated converters, non-isolated converters, and the like. To allow air circulation and convectional cooling, the micro-converter 20 can stand off the back of the corresponding PV module 22 if located at the module 22.

Advantageously, when micro-converters 20 are disposed on the back of the PV module 22 itself or are contained in a string combiner 35 (FIG. 4A and FIG. 4B), energy storage at the PV module 22 is not necessary. Instead, the energy or power generated by each individual PV module 22 and each PV string 25 is introduced to and collected on a high voltage DC (HVDC) buss 27. Because the HVDC buss 27 carries higher voltage, the associated currents are relatively low, which reduces conduction losses. Manufacturing costs associated with conductive materials are also reduced. Within the limitations of the regulatory environment, e.g., UL or CE, the higher the voltage, the more compact and economic the system.

Figure 3:
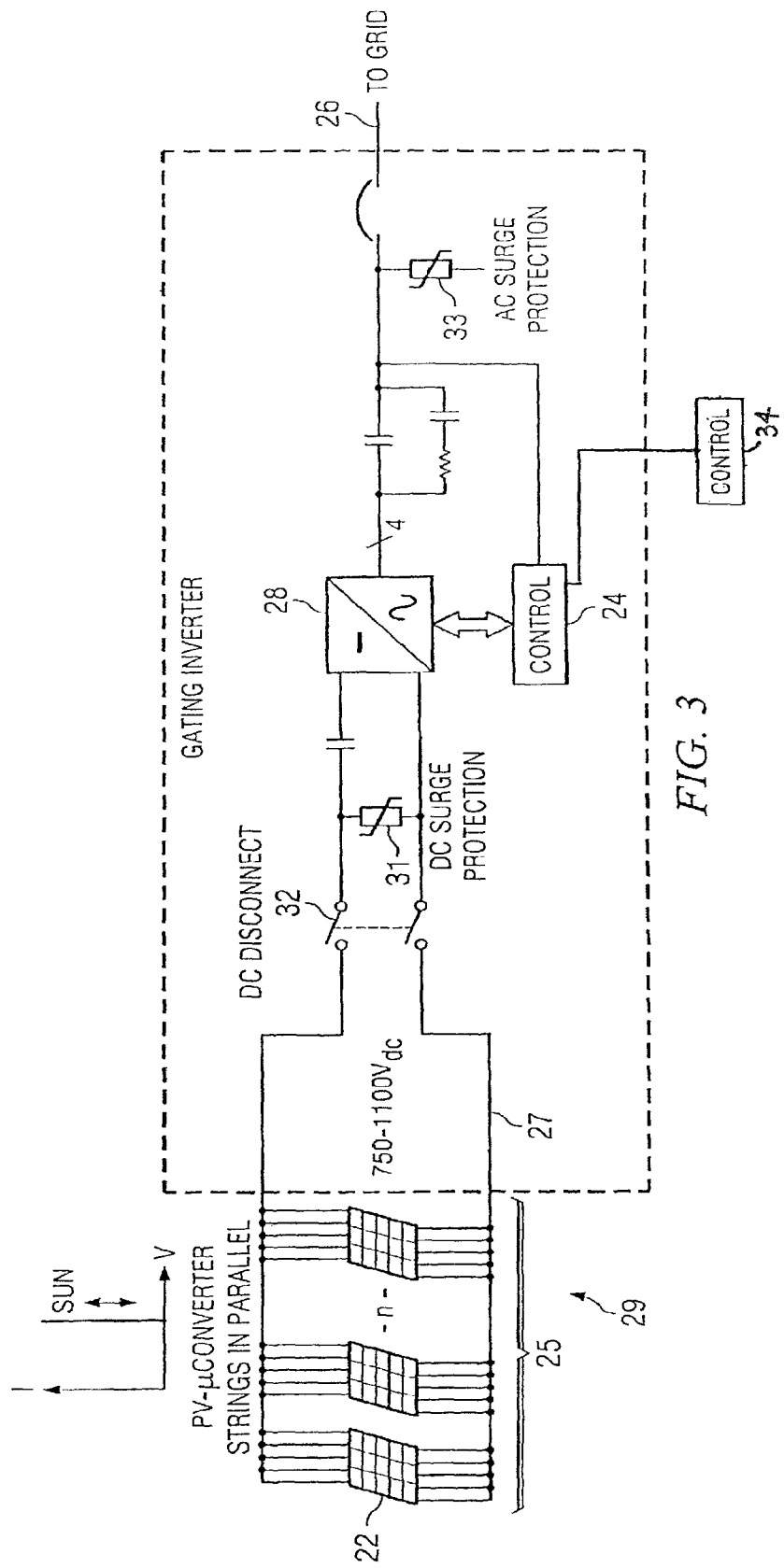
FIG. 3 shows a gating inverter in combination with a DC/DC photovoltaic system according to the present invention.

Referring to FIG. 2 and FIG. 3, the HVDC buss 27 is electrically coupled to a large, distribution substation-class, grid-connected (gating) inverter 28, the output of which is delivered to a commercial grid, to a utility grid 26 and/or to a local AC load. The gating inverter 28 includes an optional energy storage device 23 and a control unit 24, which can be organic to the inverter 28 or (as shown in FIG. 4C) can be electrically coupled to a local MPP controller 21 that is/are disposed proximate to the micro-converters 20.

DC storage of power is easily integrated with this approach and will permit different sizings of PV modules 22, PV strings 25, and gating inverters 28 so that the array sizing can be infinitely fine-grained without requiring peak power capability to be matched by the gating inverter 28. Elimination of the need for energy storage at or near each individual PV module 22 (such as the double frequency requirement of the microinverter) and integrating an energy storage device 23 with the gating inverter 28, eliminates one of the biggest problems of micro-inverter-based or micro-converter-based systems.

Energy storage is easily integrated using, for example, bi-directional converters operating from the HVDC buss 27 and/or "AC storage" 23 coupled at the output stage. "AC storage" 23 refers to a battery or other DC energy storage device in combination with a separate DC/AC inverter. In addition to readily accommodating energy storage, this architecture is also amenable to supplying relatively large DC loads and/or AC loads locally, such as for facility AC loads or industrial DC lighting, and is also compatible with modern micro-grid infrastructures where applicable. The industrial DC buss can be fed directly by the regulated dc buss of this micro-converter architecture.

Referring to FIG. 3, at the input stage of the gating inverter 28, a switching system 32 controls application of power generated by the PV array to the gating inverter 28. A DC power surge protector 31 is coupled to the HVDC buss 27 at or proximate to the switching system 32. At the output stage, to guard against AC back feed from the commercial/utility grid 26, an AC surge protector 33 is provided. The AC surge protector 33 can include rectifier diodes that serve as blocking diodes.

A commercial- or utility-scale grid 26 can generate standard voltages (480V or 600V) directly from the HVDC buss 27 without a transformer. Accordingly, optionally, the PV system 20 would not require a 60-Hz transformer, which is to say that the gating inverter 28 can be transformer-less.

Recalling that each micro-converter 20 is adapted to provide operational data, e.g., current, voltage, power, and the like, and, optionally, other data, e.g., temperature and the like, about its corresponding PV module(s) 22, the local MPP controller 21 and the control unit 24 of the gating inverter 28 are adapted to provide such operational data to a remote central controller 34. Awareness of each PV modules' operating parameters allows the central controller 34 to adjust the parameters of the boost circuit of the micro-converters 20 to maintain the chosen output voltage, or to disconnect select PV modules 22 or strings 25 from the PV array when a desired output cannot be maintained due to degradation of output. Advantageously, the ability to isolate or remove affected, low-output PV modules 22 or strings 25 prevents degrading the efficiency of the entire PV array.

The MPP controller 21, i.e., the ultra-local controller within the micro-converter 20, and the control unit 24 coupled to the gating inverter 28 constitute components of a central control system, which can include hardware and software applications. The control system is adapted to extract MPP from each individual PV module 22 and from each string 25; to selectively use all or less than all of the PV modules 22 or strings 25 at any given time for power generation; to instrument each PV module 22 for power, voltage, current, temperature, and other characteristics to achieve MPP; and to integrate energy storage fully. These applications and more can be accomplished by the MPP controller 21, by the control unit 24, and by the remote central controller 34.

The central controller 34 can also be coupled to the Internet to provide for Web-based monitoring using, for example Web-based management tools such as PV ZONE™ and PV VIEW™, which are provided by Satcon Technology Corporation. PV VIEW™ is a Web-enabled data monitoring system that is adapted to monitor power inverters. PV ZONE™ is a Web-based sub-array monitoring program that monitors solar radiation, module temperature, ambient temperature, wind speed, wind direction, and the like.

By connecting an input/output device to the Internet via a local area net (LAN), wide area net (WAN), cellular modem, and the like, the PV system 29 can provide complete real-time performance data of each micro-converter. PV VIEW™ and PV ZONE™ can include a variety of optional environmental and weather station capabilities. This information can be stored and processed on a remote Web server and can be made available from anywhere on the Web to anywhere on the Web through the PV VIEM™ Web portal.

Such Web-based tools enable users, inter alia, to meter the output of the PV system 29, e.g., kWh of operation, and to monitor meteorological information to ascertain the existence of favorable or unfavorable meteorological conditions.

As a result, the control system 34 provides a degree of energy management that includes string-level or module-level control using micro-converters 20, which enables PV systems 29 to harvest more energy and increase the kWh produced during a fixed period of time. Monitoring and control tools for commercial PV systems are provided by many third party providers. These systems are readily adapted to work with all such providers as well as with utility SCADA systems. SCADA (Supervisory Control and Data Acquisition) refers to a typically-centralized system that monitors and remotely controls aspects of power production at an entire site, at a combination of sites or at a complex that covers a relatively large area. SCADA is a proprietary, non-Web-based control system.

Advantageously, when using micro-converters 20, individual PV modules 22 can fail; however, any such failure impacts the total system power only marginally. Replacement of failed PV modules 22 can be achieved using any suitable PV module 22 of any suitable technology, eliminating requirements for exact matching as to age, size, manufacturer, and so forth, and PV system 20 downtime.

The micro-converter 20 is adapted to accommodate a full range of voltages from its corresponding PV module 22, which, currently, is typically between approximately 10 VDC and approximately 150 VDC. For example, a micro-converter 20 can boost module output from 48 VDC (typical) to a fixed voltage nominally of 550 to 1200 VDC, further allowing for significantly lowered interconnect currents and establishing a standard for the interconnect that allows the gating inverter 28 design to be simplified and, if desired, interconnection transformers to be eliminated. Lower interconnect current reduces interconnect transmission losses and allows for smaller, less expensive interconnect conductors.

Comparing the currently disclosed DC/DC micro-converter concept with the DC/AC micro-inverter concept, the fundamental issues are those of DC power versus AC power and high voltage versus low voltage. For example, with AC, the ratio of RMS-to-average value is 0.707V/0.636V or about 1.11. As a result, the conduction losses associated with an AC are 1.11 squared, or 23% higher than for a DC system. This result, however, assumes identical busswork, when, in reality, the AC system has 40% higher voltage stress than an equivalent DC system, making a DC system even more preferable.

Another advantage of AC versus DC has to do with skin depth. Normally, buss bars for heavy AC current are rarely more than ½ inch (12 mm) in diameter except when mechanical reasons dictate using a larger buss bar. As current magnitudes increase, which is certainly the case in large commercial PV systems, and line frequency remains relatively low (60 Hz), a wire radius larger than $\frac{1}{3}^{rd}$ of an inch (8 mm) could be used to advantage to reduce conduction losses. With a skin depth in copper of 6 mm. and a skin depth in aluminum of approximately 8 mm., there is little value in using conductor cables that are more than ½-inch in diameter.

The final points of comparison between micro-inverter and micro-converter approaches relates to the reduced electronics and dramatic reduction in energy storage requirements for the micro-converter. The requirement for double line frequency energy storage and location of the micro-inverter proximate to the module mean that even well-built, initially-reliable units are liable to suffer from wear and tear after several years have passed due to the use of electrolytic capacitors.

Integrated Active Clamp Device

Figure 6:
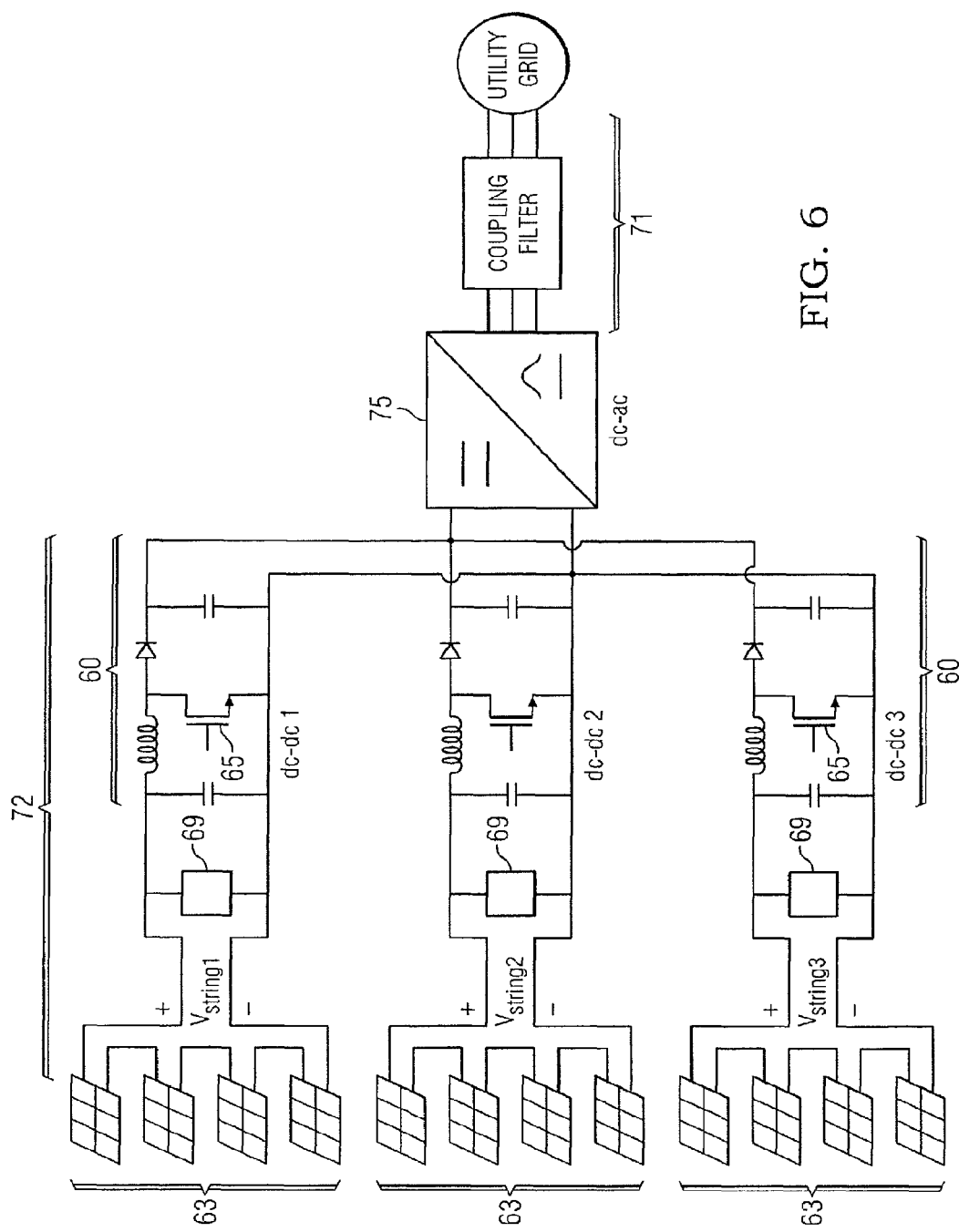
FIG. 6 shows an array of PV string-based micro-converters having an active clamp device in accordance with the present invention.

Elevated voltage at the input terminals of a DC-DC micro-converter, e.g., from a PV solar array, may exceed the maximum or breakdown voltage ($V_{br}$) of semiconductor devices, e.g., MOSFETs, IGBTs, and so forth, used in the micro-converter, damaging, and likely destroying, these devices. These deleterious elevated voltages may be caused by a transient condition or, often, may be due to extremely cold conditions that drive up the solar PV array open-circuit voltage ($V_{oc1}$ or $V_{oc2}$). For example, referring to FIG. 6, while the PV system 70 is in operation, an event on either the dc side 72 or the grid side 71 of the inverter 75 may cause the system 70 as a whole to trip off line. If the ambient conditions are sufficiently cold, the situation described can readily develop. Indeed, when the sun begins to shine on cold, previously-dormant PV panels in a PV string 63, there is very little current flow, but voltage being produced by the PV strings 63 is relatively high.

Complicating the voltage increase at the PV strings 63, when cold, the breakdown voltage ($V_{br}$) of various semiconductor devices in the micro-converter 60 decreases, which produces a highly disadvantageous condition. Indeed, if the open-circuit voltage ($V_{oc}$) from the PV strings 63 passing through the semiconductor devices of a micro-converter 60 exceeds the breakdown voltage ($V_{br}$) of those semiconductor devices, the semiconductor devices can be damaged or destroyed, which also may cause collateral damage.

Figure 7:
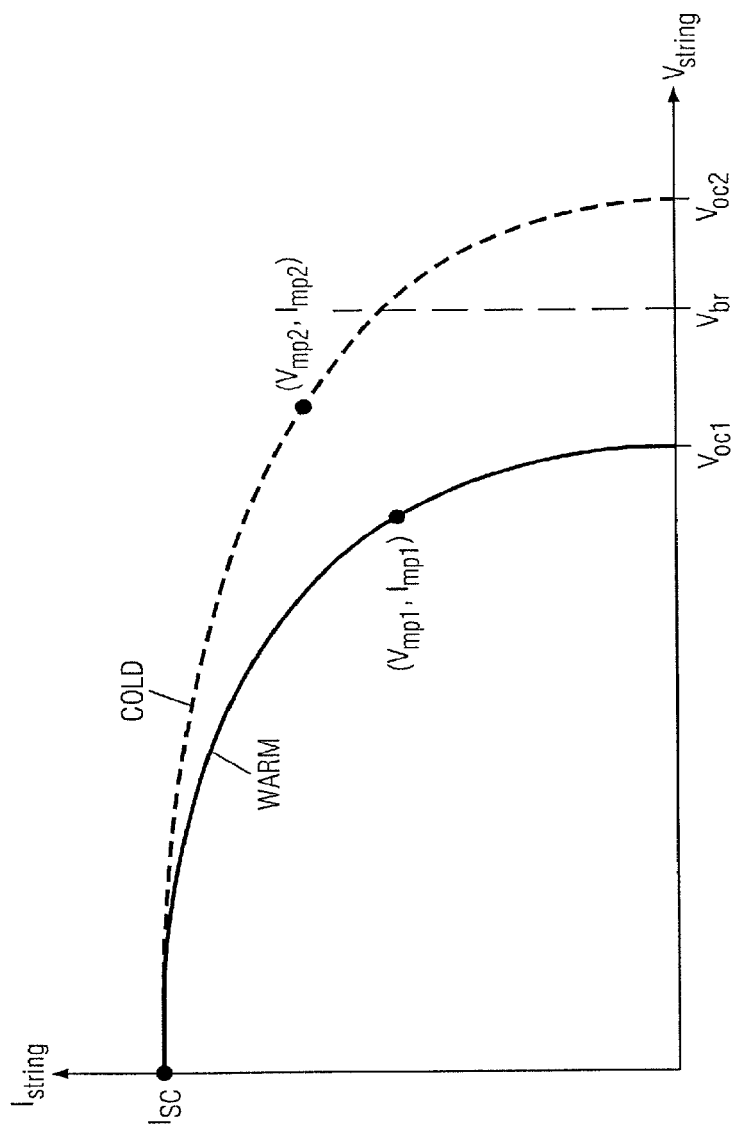
FIG. 7 shows voltage-current curves characteristic of solar PV strings for warm and cold operating conditions.

This is shown schematically in FIG. 7, which shows representative relative voltage-current characteristics of a PV panel or PV string 63 in cold and warm operating temperatures. The voltage-current curves include maximum power points ($V_{mp}$, $I_{mp}$) for each condition.

Those of ordinary skill in the art can appreciate that converters 60 are normally sized for peak current from the PV string 63 and, moreover, that the PV string 63 is, in reality, a current-limited source. As a result, when a high-voltage condition develops, which is to say that, in instances in which the PV string 63 operating point ($V_{mp}$, $I_{mp}$) or, more likely, the open-circuit voltage ($V_{oc1}$ or $V_{oc2}$) approaches the maximum voltage ($V_{br}$) of the semiconductor devices, turning ON semiconductor switching devices 65 in each micro-converter 60 controlling a corresponding PV string 63 advantageously creates a short-circuit. The effect of shorting the micro-converters 60 is to clamp the PV array or PV string 63 voltage at or substantially at zero.

The zero voltage condition in FIG. 7 is labeled as $I_{sc}$. $I_{sc}$ refers to the short-circuit current of the PV string 63. During a zero voltage condition the operating voltage is zero so the likelihood of damaging or destroying the semiconductor devices is nil.

Advantageously, during zero voltage clamping, the PV strings 63 are loaded, causing each PV string 63 inherently to heat up. As the PV strings 63 heat up, the open-circuit voltage ($V_{oc2}$) decreases, permitting a subsequent power up of the PV string 63 at lower voltages. Furthermore, the breakdown voltage ($V_{br}$) of the semiconductor devices increases as they warm up. When the semiconductor devices are sufficiently warm, the breakdown voltage ($V_{br}$) is greater than the open-circuit voltage ($V_{oc1}$) and the semiconductor switching devices 65 can be turned OFF.

Accordingly, the micro-converter 60 and system 70 described hereinabove can be improved by integrating an active clamp device 69 into each micro-converter 60. Clamp devices and their uses are well-known to the art and need not be described in great detail. The integrated active clamp device 69 of the present invention includes a voltage sensing device, a comparator, and a control device, which could be the control system for the entire micro-converter or a separate controller just for the active clamp device 69.

A voltage sensing device (not shown) is adapted to measure voltage on each PV string 63. The voltage sensing device outputs a voltage signal commensurate with the measured voltage to a comparator (not shown). The comparator compares the output voltage signal to a pre-established threshold voltage that is less than or equal to the limiting breakdown voltage ($V_{br}$) of any of the semiconductors devices integrated into the micro-converter 60.

When the output voltage signal equals the pre-established threshold voltage, the control device (not shown) of the active clamp device 69 automatically and instantly turns ON the semiconductor switching device(s) 65 of each micro-controller 60 at which the measured voltage equals the pre-established threshold voltage and/or the breakdown voltage ($V_{br}$) of the semiconductors devices. This creates a zero voltage condition.

Ground Fault Deduction from Apparent Power Measurements/Comparisons

As the use and popularity of solar power has increased, the occurrence of numerous fires at various solar energy sources has caused extensive damage to the sources themselves and to related ancillary structures and, furthermore, has hindered the rate of expansion of the use of solar power for industrial and residential applications. In many instances, the fires were caused by ground or stray current problems, often resulting from shoddy construction in which local heating of wiring has progressively created major fires.

To avoid such events, the National Electric Code (the "Code") requires that when an inverter recognizes a ground fault, the inverter must disconnect the source from the utility grid or micro-grid. Then, the cause of the flowing current condition, which is evidence of the ground fault, must be ascertained and repaired before the inverter re-connects the power source to the grid or micro-grid. Accordingly, the micro-converter and system described hereinabove can be improved by providing means for detecting or deducing a ground fault condition at each micro-converter, which is to say at the PV string level, so that strings 63 and not the entire system 70 are off-line.

Figure 8:
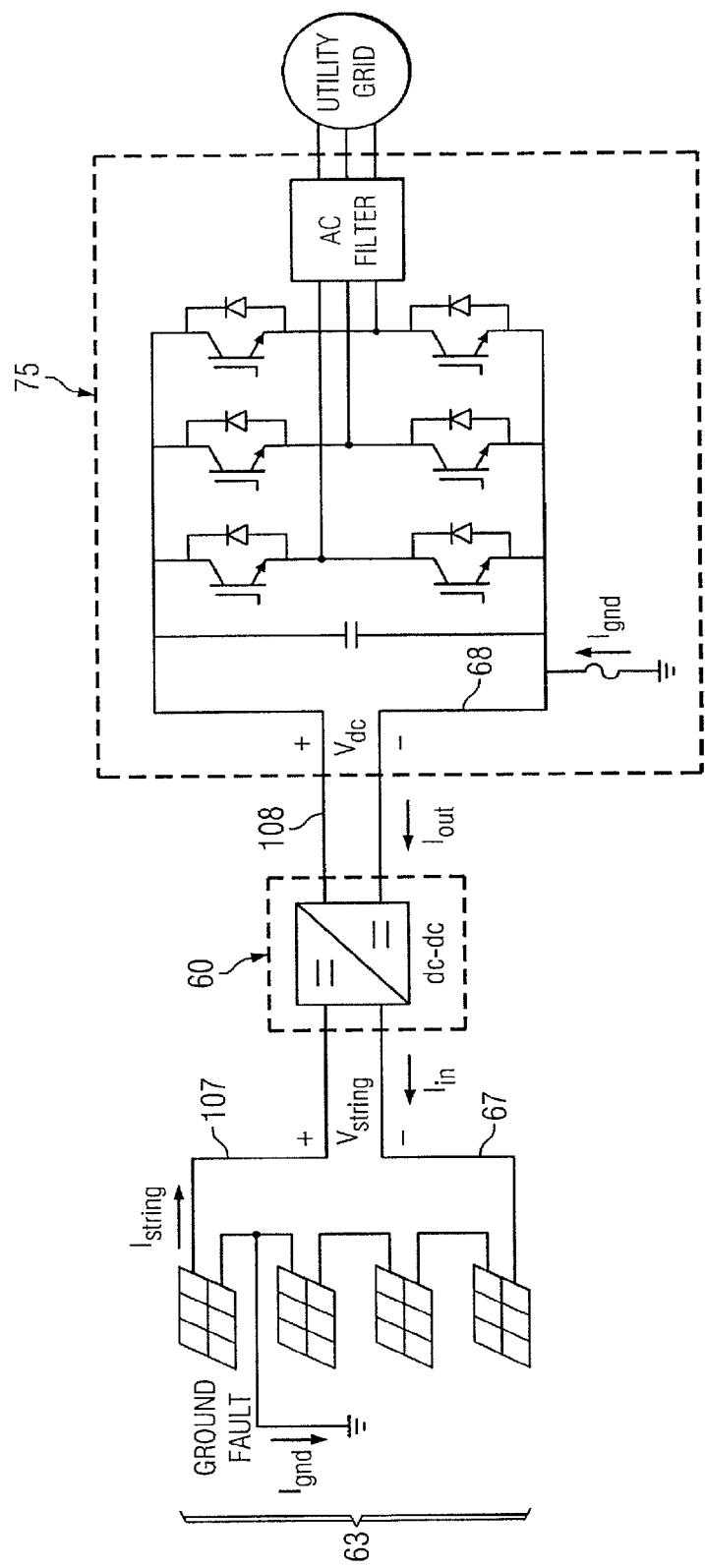
FIG. 8 shows a diagrammatic of a ground fault condition in a PV string-based micro-converter.

Referring to FIG. 8, because there is minimal energy storage within the micro-converter 60, for time scales longer than several switching periods, input power from the PV string 63 equals or essentially equals the output power from the micro-converter 60. Mathematically, $$V_{string} \cdot I_{in} = V_{dc} \cdot I_{out}$$

in which $V_{string}$ is the voltage from the corresponding PV string 63, $V_{dc}$ is the output voltage to the inverter 75, and the currents $I_{in}$ and $I_{out}$ are each measured, respectively, on leads 67 and 68, which correspond to the input of the micro-converter 60 and the output of the micro-converter 60, respectively.

If the relationship does not hold true, there is only a finite number of explanations. For example, either some of the sensing elements are faulty or, more likely, an additional current $I_{gnd}$, i.e., a stray or ground current, is being superimposed on the micro-converter wiring. This additional current $I_{gnd}$ adds to one of either the input or output variables and subtracts from the other and, most likely, is indicative of a ground fault current.

As a result, by identifying an apparent power mismatch, micro-converters 60 can be used as a ground fault detector at the PV string level rather than at the system level. Advantageously, only a single PV string 63 rather than the entire system would have to be disconnected from the inverter 75 and the grid or micro-grid. As a result, the micro-converter 60 for each PV string 63 can be adapted to measure all of these input and output variables/values. The measured variables/values can then be manipulated to verify that input power equals output power.

Figure 9:
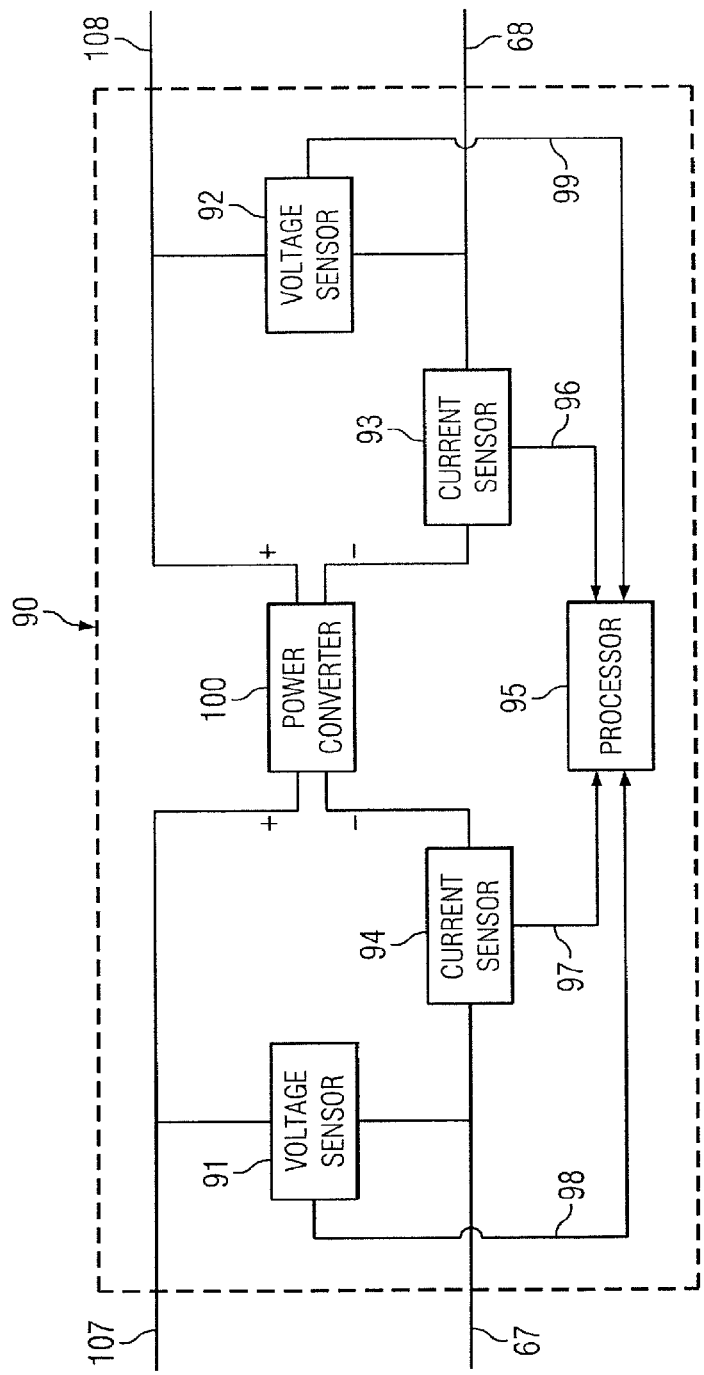
FIG. 9 shows a block diagram of a ground fault detecting device integrated into a micro-converter.

In its simplest embodiment, referring to FIG. 9, the ground fault detector 90 can be a separate device or can be integrated into the improved micro-converter 60. The ground fault detector 90 includes a control or processing device 95 that is structured and arranged to receive measured voltage signals 98 and 99 from voltage measurement devices 91 and 92 and to receive measured current signals 96 and 97 from current measurement devices 93 and 94, which are disposed on the output negative lead 67 and input negative lead 67. The output current sensor 93 could be installed on either the negative output lead 68 or the positive output lead 108. The input current sensor 94 could be installed on either the negative input lead 67 or the positive input lead 107. The control or processing device 95 could be a stand alone processor or the processing function can be performed on any control system described hereinabove.

The processing device 95 can be hardwired or can include an application, drive program, software, and the like to calculate input power and output power using the formula above. The control or processing device 95 also includes a comparator function that can be used to compare input power to output power. The comparator is adapted to provide a signal to the control or processing device 95 when the comparison of the powers indicates a ground fault current. The processing device 95 is further adapted to disconnect the particular PV string 63 from the voltage buss when there is a power mismatch as evidenced by an inequality of input power and output power. Those PV strings 63 at which there is no indication of a ground fault condition remain connected to the inverter 75 and the inverter 75 remains connected to the utility grid or micro-grid.

Fractional Power Converter

Another traditional use of converters is to harvest energy from PV power sources by converting or processing power at its native voltage to an alternative, constant voltage level for the load. Say, for example, a PV string provides 2.9 kW of power to the converter. Under conventional practice, the converter should be sized to process 2.9 kW of power plus or minus ten percent (±10%) to account for changes and variations from the PV string. The efficiency of the converter represents the fraction of energy successfully converted from the PV source to the load, which is to say that power that is not lost.

An alternative means of harvesting energy is to allow the power source to deliver some of its energy directly to the load while processing only a relatively small portion of the source power to supplement that which is delivered directly. Advantageously, for the power that is delivered directly, there is no need to process the power and there is no energy lost to the energy harvesting converter. Hence, processing can be reduced from 100 percent±10% to just the ±10%. This is referred to as partial power processing, which can be practiced using a fractional power converter.

Figure 10:
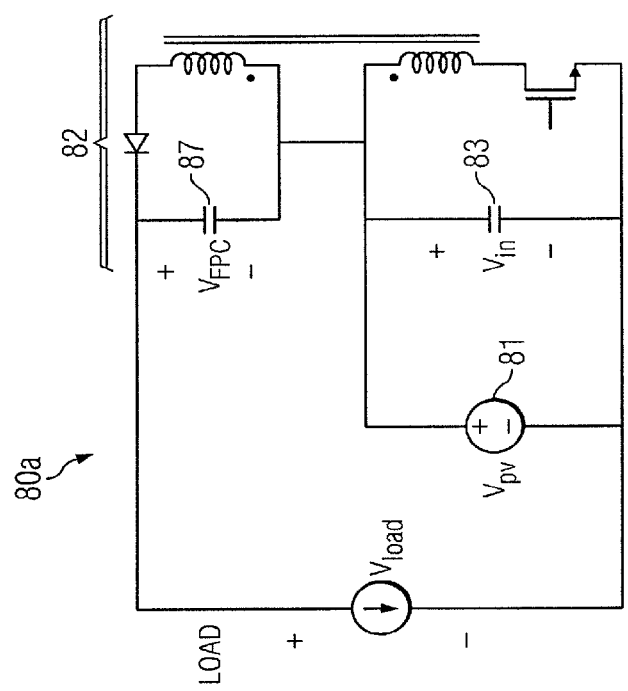
FIG. 10 shows a micro-converter and a voltage injection-based fractional power converter in parallel with the power source for injecting voltage in series with the power source.
Figure 11:
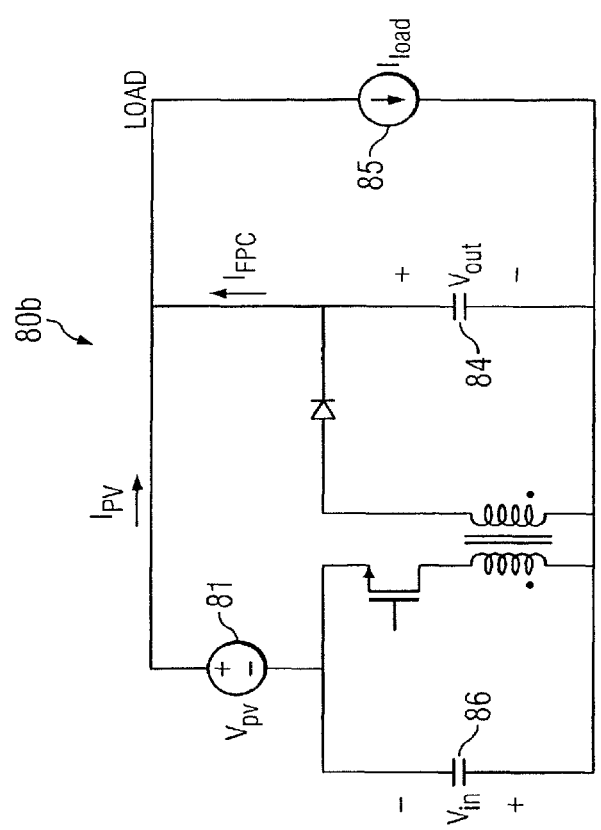
FIG. 11 shows a micro-converter and a current injection-based fractional power converter in series with the power source for injecting current in parallel with the power source.

FIGS. 10 and 11 show embodiments of energy harvesting circuits 80*a*, 80*b* that are structured and arranged to convert, respectively, voltage or current to required or desired levels for the load 85. Such harvesting is made possible by converting only a fraction of the total power. With these arrangements, the PV source 81 delivers a majority of the total power directly to the load 85 while a smaller fraction of the power is processed. This is achieved using either a voltage injection fractional power converter (FPC) approach or a current-injection FPC approach. Advantageously, FPCs perform partial power processing, which, in large part, results from cell, panel, string, and or array mismatch, at the PV cell or PV module level.

FIG. 10 shows a voltage injection-type FPC system 80*a* that, for the purpose of illustration and not limitation, is based on a flyback converter. Those of ordinary skill in the art can appreciate that converter types for the voltage injection-type FPC system 80*a* other than a flyback converter are possible. The micro-converter 60 includes an FPC 82 that is structured and arranged to convert PV source voltage to a higher level for the load 85. For this purpose, as shown in FIG. 10, the FPC 82 with output 87 is in series with the PV source 81 and the FPC 82 is adapted to draw a fraction of the total power from the PV source 81 through a parallel input port 83, and to inject a voltage ($V_{FPC}$) in series with voltage ($V_{IN}$) directly from the PV (voltage) source 81. The injected voltage provides the additional voltage necessary to meet required or desired amounts.

FIG. 11 shows a current injection-type FPC systems 80*b* that, also, for the purpose of illustration and not limitation, is based on a flyback converter. Here again, those of ordinary skill in the art can appreciate that converter types for the current injection-type FPC system 80*b* other than flyback converters are possible. The FPC 84 is structured and arranged to convert PV source voltage to a lower level for the load 85. More particularly, the FPC 84 is adapted to draw a fraction of the total power from the PV source 81 through a series input port 86, and to inject current ($I_{FPC}$) in parallel with the output current ($I_{PV}$) directly from the PV source 81.

Optionally, these FPCs can be bi-directional (not shown), which will provide the plus-or-minus 10%. However, this requires additional active semiconductor devices. Advantageously, bi-directional converters have a single circuit that is capable of injecting power in series (as voltage) or in parallel (as current) while being powered from the other port. This approach can be applied at any level, from the array, to the sub-array, to the string, to the module, and even down to the cell level, where, by comparison, smaller corrections are necessary.

Many changes in the details, materials, and arrangement of parts and steps, herein described and illustrated, can be made by those skilled in the art in light of teachings contained hereinabove. Accordingly, it will be understood that the following claims are not to be limited to the embodiments disclosed herein and can include practices other than those specifically described, and are to be interpreted as broadly as allowed under the law.

What is claimed is:

1. A system for photovoltaic power generation comprising:
   a plurality of power-generating photovoltaic strings, wherein each of the power-generating photovoltaic strings comprise a plurality of power-generating photovoltaic modules;
   a plurality of direct current (DC)/DC micro-converters, wherein the DC/DC micro-converters are electrically coupled to the power-generating photovoltaic modules, to the power-generating photovoltaic string, or both;
   a plurality of active clamps electrically coupled to the DC/DC micro-converters, wherein the plurality of active claims are configured to limit the power-generating photovoltaic strings to less than or equal to pre-established threshold voltage by creating a short-circuit;
   a gating inverter electrically coupled to DC/DC micro-converters and to one or more electrical loads; and
   a central controller electrically coupled to the gating inverter.

2. The system of claim 1, wherein the active clamps are integrated within at least some of the DC/DC micro-converters.

3. The system of claim 1, wherein at least some of the plurality of active clamps comprises a voltage sensing component configured to measure an output voltage for each of the power-generating photovoltaic strings.

4. The system of claim 3, wherein the at least some of the plurality of active clamps comprises a comparator configured to compare the output voltage for at least one of the power-generating photovoltaic strings with a pre-established threshold voltage.

5. The system of claim 4, wherein the at least some of the plurality of active clamps comprise a controller configured to switch one or more switching components to an on state to create the short-circuit based upon the output of the comparator.

6. The system of claim 4, wherein the pre-established threshold voltage is less than or equal to a limiting breakdown voltage of the power-generating photovoltaic modules.

7. The system of claim 1, wherein the gating inverter is electrically coupled to the DC/DC micro-converters via one or more high voltage DC buss such that the power generated from power-generating photovoltaic modules are not stored at the power-generating photovoltaic modules.

8. The system of claim 1, wherein the DC/DC micro-converters comprise at least one maximum power point controller configured to regulate output voltages of the power-generating photovoltaic strings based upon the maximum power of the power-generating photovoltaic strings.

9. A system for photovoltaic power generation comprising:
   a plurality of power-generating photovoltaic strings comprising a plurality of power-generating photovoltaic modules;
   a plurality of direct current (DC)/DC micro-converters, wherein the DC/DC micro-converters are electrically coupled to at least one of the following: the power-generating photovoltaic modules or the power-generating photovoltaic string;
   at least one ground fault detector electrically coupled to the DC/DC micro-converters, wherein the at least one ground fault detector is configured to detect a ground fault for one of the power-generating photovoltaic strings;
   an inverter electrically coupled to DC/DC micro-converters and to one or more loads; and
   a controller electrically coupled to the inverter.

10. The system of claim 9, wherein the at least one ground fault detector is integrated within at least one of the DC/DC micro-converters.

11. The system of claim 9, wherein the at least one ground fault detector is configured to disconnect the one of the power-generating photovoltaic strings from a voltage buss when detecting the ground fault for the one of the power-generating photovoltaic strings, wherein the voltage buss electrically couples the inverter to the DC/DC micro-converters.

12. The system of claim 9, wherein the inverter comprises an energy storage and is electrically coupled to the DC/DC micro-converters via at least one high voltage DC buss, and wherein the power generated from power-generating photovoltaic modules are stored at the energy storage of the inverter.

13. The system of claim 9, wherein each of the DC/DC micro-converters comprise a maximum power point controller adapted to regulate output voltages from a corresponding power-generating photovoltaic strings of the power-generating photovoltaic strings based on a point of maximum power for the corresponding power-generating photovoltaic string.

14. The system of claim 9, wherein the at least one ground fault detector is configured to detect the ground fault for the one of the power-generating photovoltaic strings by:
   measuring the voltages of the one of the power-generating photovoltaic strings and the output voltage of the inverter;
   measuring the input current of the DC/DC micro-converter and the output current of the DC/DC micro-converter associated with the one of the power-generating photovoltaic strings; and
   comparing the product of the voltage of the one of the power-generating photovoltaic strings and the input current of the DC/DC micro-converter associated with the one of the power-generating photovoltaic strings with the product of the output voltage of the inverter and the output current of the DC/DC micro-converter associated with the one of the power-generating photovoltaic strings.

15. A system for photovoltaic power generation comprising:
   a plurality of power-generating photovoltaic strings comprising a plurality of power-generating photovoltaic modules;
   a plurality of direct current (DC)/DC micro-converters, wherein the DC/DC micro-converters are electrically coupled to the power-generating photovoltaic modules, to the power-generating photovoltaic string, or both, and wherein at least some of the DC/DC micro-converters comprise a fractional power converter adapted to draw a fraction of a total power from the plurality of power-generating photovoltaic strings;
   an inverter electrically coupled to DC/DC micro-converters and to at least one grid; and
   a control system electrically coupled to the inverter.

16. The system of claim 15, wherein the fractional power converter is a voltage-injection fractional power converter.

17. The system of claim 16, wherein the voltage-injection fractional power converter is adapted to inject a voltage that is in series with an input voltage supplied by the power-generating photovoltaic strings.

18. The system of claim 15, wherein the fractional power converter is a current-injection fractional power converter.

19. The system of claim 18, wherein the current-injection fractional power converter is adapted to inject a current that is in parallel with an output current directly generated by the power-generating photovoltaic strings.

20. The system of claim 15, wherein the fractional power converter is bi-directional, wherein the inverter comprises an energy storage, wherein the inverter is electrically coupled to the DC/DC micro-converters via at least one high voltage DC buss, and wherein the power generated from power-generating photovoltaic modules are stored at the energy storage of the inverter without storing the power generated from power-generating photovoltaic modules at the power-generating photovoltaic modules.

* * * * *